United States Patent
Reznicek (10) Patent No.: US 9,419,079 B1
(45) Date of Patent: Aug. 16, 2016

(54) LOW DEFECT RELAXED SIGE/STRAINED SI STRUCTURES ON IMPLANT ANNEAL BUFFER/STRAIN RELAXED BUFFER LAYERS WITH EPITAXIAL RARE EARTH OXIDE INTERLAYERS AND METHODS TO FABRICATE SAME

(71) Applicant: International Business Machines Corporation, Armonk, NY (US)

(72) Inventor: Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/746,066

(22) Filed: Jun. 22, 2015

Related U.S. Application Data (63) Continuation of application No. 14/700,568, filed on Apr. 30, 2015.

(51) Int. Cl.
*H01L 29/10* (2006.01)
*H01L 29/161* (2006.01)
*H01L 29/167* (2006.01)

(52) U.S. Cl.
CPC ......... *H01L 29/1054* (2013.01); *H01L 29/161* (2013.01); *H01L 29/167* (2013.01)

(58) Field of Classification Search
CPC ............ H01L 21/26506; H01L 29/167; H01L 21/823807; H01L 21/823814; H01L 29/7848; H01L 29/6653; H01L 29/66636; H01L 29/7834; H01L 29/1054; H01L 29/161
USPC ........................................................ 257/607
See application file for complete search history.

(56) References Cited

U.S. PATENT DOCUMENTS

| | | | |
|---|---|---|---|
| 6,610,548 B1 | 8/2003 | Ami et al. |
| 6,852,575 B2 | 2/2005 | Bojarczuk et al. |
| 7,135,699 B1 | 11/2006 | Atanackovic |
| 8,796,121 B1 | 8/2014 | Dargis et al. |
| 8,823,055 B2 | 9/2014 | Arkun et al. |

(Continued)

FOREIGN PATENT DOCUMENTS

| CN | 103208586 A | 1/2012 |
|---|---|---|
| CN | 102610322 A | 3/2012 |

OTHER PUBLICATIONS

J. Weiser et al., "NMOS and PMOS transistors fabricated in strained silicon/relaxed silicon—germanium structures," IEDM Tech. Dig., pp. 1000-1002, 1992.*

*Primary Examiner* — Walter H Swanson
(74) *Attorney, Agent, or Firm* — Harrington & Smith (57) ABSTRACT

A method provides a substrate having a top surface; forming a first semiconductor layer on the top surface, the first semiconductor layer having a first unit cell geometry; epitaxially depositing a layer of a metal-containing oxide on the first semiconductor layer, the layer of metal-containing oxide having a second unit cell geometry that differs from the first unit cell geometry; ion implanting the first semiconductor layer through the layer of metal-containing oxide; annealing the ion implanted first semiconductor layer; and forming a second semiconductor layer on the layer of metal-containing oxide, the second semiconductor layer having the first unit cell geometry. The layer of metal-containing oxide functions to inhibit propagation of misfit dislocations from the first semiconductor layer into the second semiconductor layer. A structure formed by the method is also disclosed.

16 Claims, 5 Drawing Sheets

(56) References Cited

U.S. PATENT DOCUMENTS

| | | |
|---|---|---|
| 8,846,504 B1 | 9/2014 | Dargis et al. |
| 2002/0153579 A1 | 10/2002 | Yamamoto |
| 2005/0035409 A1* | 2/2005 | Ko .................. H01L 21/26506 257/350 |
| 2005/0189610 A1* | 9/2005 | Usuda ............... H01L 21/76243 257/510 |
| 2007/0072439 A1 | 3/2007 | Akimoto |
| 2008/0241519 A1* | 10/2008 | Schroeder ......... H01L 21/02381 428/332 |
| 2009/0289251 A1 | 11/2009 | Kiyotoshi |
| 2010/0123136 A1 | 5/2010 | Lee |
| 2012/0256232 A1 | 10/2012 | Clark et al. |
| 2013/0015437 A1 | 1/2013 | Yamazaki |
| 2014/0145312 A1 | 5/2014 | Wang et al. |
| 2014/0239307 A1 | 8/2014 | Dargis et al. |
| 2014/0246679 A1 | 9/2014 | Arkun et al. |
| 2015/0333181 A1 | 11/2015 | Zeng |

* cited by examiner

LOW DEFECT RELAXED SIGE/STRAINED SI STRUCTURES ON IMPLANT ANNEAL BUFFER/STRAIN RELAXED BUFFER LAYERS WITH EPITAXIAL RARE EARTH OXIDE INTERLAYERS AND METHODS TO FABRICATE SAME

CROSS-REFERENCE TO A RELATED US PATENT APPLICATION

This patent application is a continuation application of copending U.S. patent application Ser. No. 14/700,568, filed on Apr. 30, 2015, the disclosure of which is incorporated by reference herein in its entirety.

TECHNICAL FIELD

The embodiments of this invention relate generally to semiconductor devices and fabrication techniques and, more specifically, relate to the fabrication of semiconductor transistor devices.

BACKGROUND

For more than three decades, the continued miniaturization of metal oxide semiconductor field effect transistors (MOSFETs) has driven the worldwide semiconductor industry. Various impediments to continued scaling have been predicted for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, the development of further methods for improving performance, in addition to scaling, has become critical. One such method involves providing strained channels for the CMOS circuits, using SiGe implant anneal buffer (IAB) and strain relaxed buffer (SRB) technologies.

IAB/SRB layers are thus currently considered as being technology contenders for future development of small geometry semiconductor devices to enable an ability to provide FINFETs having different channel materials and different channel strain on the same substrate. After a relaxed top SiGe layer is formed strained Si could be grown on the relaxed top SiGe layer to form an nFET. In order to form a pFET device a higher percentage (of Ge) strained SiGe could be grown on the relaxed top SiGe layer.

However, a problem that can arise with respect to this fabrication process relates to a high defect density that can be present at the surface of the IAB/SRB layer.

SUMMARY

In a first aspect thereof the embodiments of this invention provide a method that includes providing a substrate having a top surface; forming a first semiconductor layer on the top surface of the substrate, the first semiconductor layer having a first unit cell geometry; epitaxially depositing a layer comprised of a metal-containing oxide on the first semiconductor layer, the layer of metal-containing oxide having a second unit cell geometry that differs from the first unit cell geometry; ion implanting the first semiconductor layer through the layer comprised of a metal-containing oxide; annealing the ion implanted first semiconductor layer; and forming a second semiconductor layer on the layer comprised of a metal-containing oxide, the second semiconductor layer having the first unit cell geometry.

In another aspect thereof the embodiments of this invention provide a structure that includes a substrate having a top surface; a first semiconductor layer disposed on the top surface of the substrate, the first semiconductor layer having a first unit cell geometry; and a layer comprised of a metal-containing oxide disposed on the first semiconductor layer. The layer of metal-containing oxide has a second unit cell geometry that differs from the first unit cell geometry to inhibit propagation of misfit dislocations from the first semiconductor layer into the second semiconductor layer. The structure further includes a second semiconductor layer disposed on the layer comprised of the metal-containing oxide, the second semiconductor layer having the first unit cell geometry.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in implementing the embodiments of this invention include, but are not limited to, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process typically ranges from about 550° C. to about 900° C. Although higher temperature typically results in faster deposition, the faster deposition may result in crystal defects and film cracking.

Before describing the embodiments of this invention, and in order to provide an appreciation for the benefits derived from the use of the exemplary embodiments of this invention, reference will be made first to FIGS. 1-5 for describing one approach in order to illustrate the origination of the problem that was alluded to above.

Figure 1:
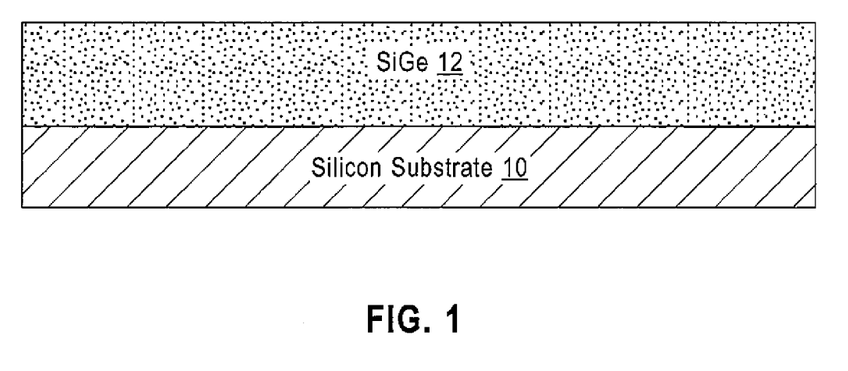
FIG. 1 shows in an enlarged cross-sectional view (not to scale) a (compressively) strained $Si_{1-x}Ge_x$ layer that is grown on a Silicon substrate.

FIG. 1 shows in an enlarged cross-sectional view (not to scale) a (compressively) strained $Si_{1-x}Ge_x$ layer 12 that is grown on a Silicon substrate 10. The $Si_{1-x}Ge_x$ layer 12 could have a Ge percentage of, for example, 20%-40% (i.e., x=0.2 to 0.4), and could have a thickness in a range of, by example only, about 250 nm to about 1000 nm.

Figure 2:
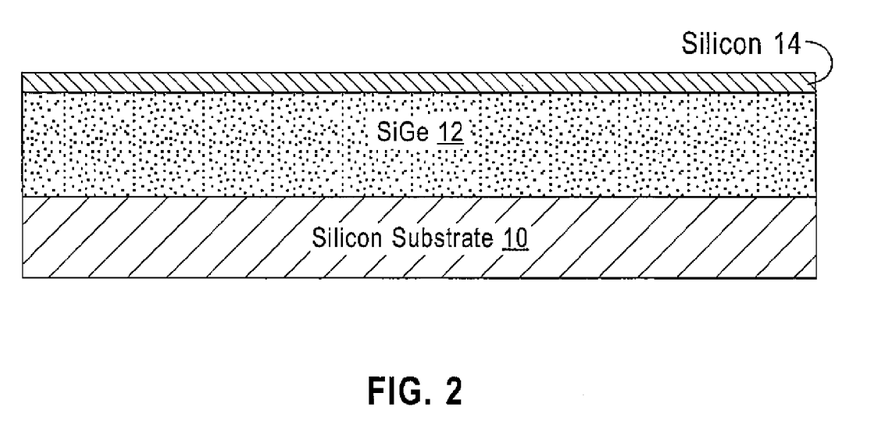
FIG. 2 shows a result of growing an unstrained Silicon cap layer on the SiGe layer.

FIG. 2 shows a result of growing an unstrained Silicon cap layer 14 on the SiGe layer 12. The Silicon cap layer 14 can have a thickness in a range of about 5 nm to about 50 nm.

Figure 3:
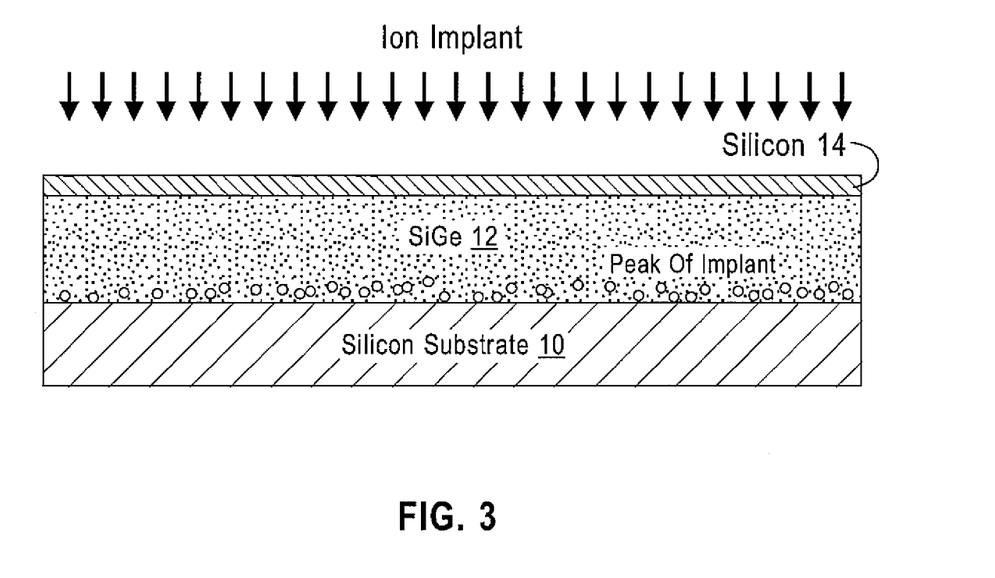
FIG. 3 shows a result of the performance of an ion implant process to form dislocation nucleation centers in the SiGe layer.

FIG. 3 shows a result of the performance of an ion implant process where one of, for example, Hydrogen, Helium or Argon is implanted to form defects that in turn form dislocation nucleation centers (shown as small circles). The implant energy is established so that preferably the implant peak is positioned in the SiGe layer 12 near to the interface with the Silicon substrate 10.

Figure 4:
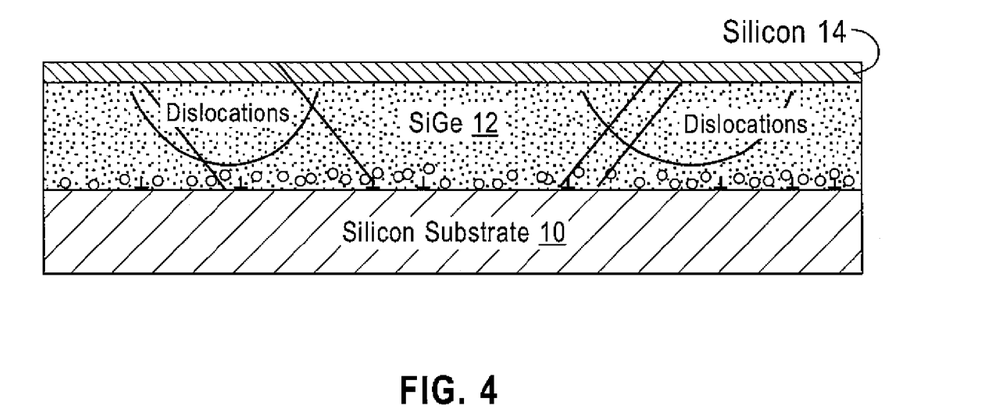
FIG. 4 shows a result of the performance of an anneal process to form misfit dislocations (dislocation loops) originating from the nucleation centers and to strain the Silicon cap layer.

FIG. 4 shows a result of the performance of an anneal process to form misfit dislocations and associated threading dislocations (dislocation loops) originating from the nucleation centers. This relaxes the compressively strained SiGe layer 12 and thus strains the previously unstrained Silicon cap layer 14. As shown, most of the threading dislocations will stop at or reflect from the upper Si/SiGe interface. However, some of the threading dislocations will extend into the Silicon cap layer 14. The Si cap layer 14, which previously had the lattice constant of the Si substrate 10, now exhibits the lattice constant of the SiGe layer 12 and becomes a strained Si layer.

Figure 7:
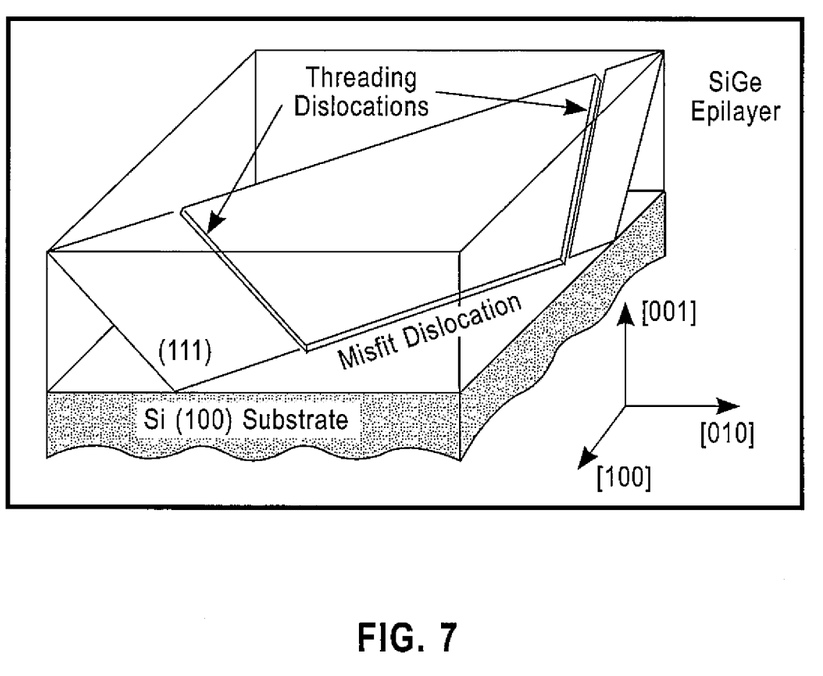
FIG. 7 is a diagram that is useful in describing misfit dislocations and associated threading dislocations.

FIG. 7 depicts in greater detail the threading dislocations that arise from a presence of misfit dislocations that exist at the interface of the substrate surface and a bottom surface of the SiGe epilayer. In this example the substrate is a Si{100} layer and the threading dislocations exist in the SiGe epilayer and extend towards and to the top surface of the SiGe epilayer.

To summarize to this point, the compressively strained SiGe layer 12 is formed on the silicon substrate 10. Atoms are ion-implanted onto the SiGe layer 12 to cause hydrogen/helium small platelets formation during anneal. Annealing is then performed to form the platelets, and form and move the dislocations in order to relax the strained SiGe layer 12. During the anneal process interstitial dislocation loops are formed. The interstitial dislocation loops provide a basis for nucleation of misfit dislocations between the SiGe layer 12 and the silicon substrate 10, thereby relaxing the SiGe layer 12. The top silicon cap layer 14 formed on the SiGe layer 12 functions as a reflection layer, "bouncing" the dislocations back due the local strain difference at the Si/SiGe interface.

Figure 5:
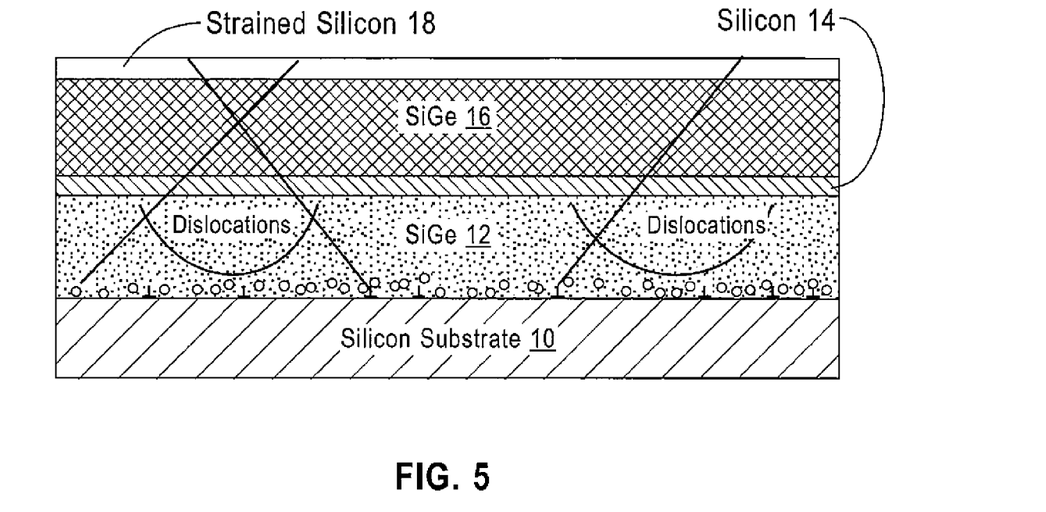
FIG. 5 shows a result of the formation of additional layers on the strained Si cap layer including a second SiGe layer and an optional strained Si layer (or a SiGe layer).
Figure 8:
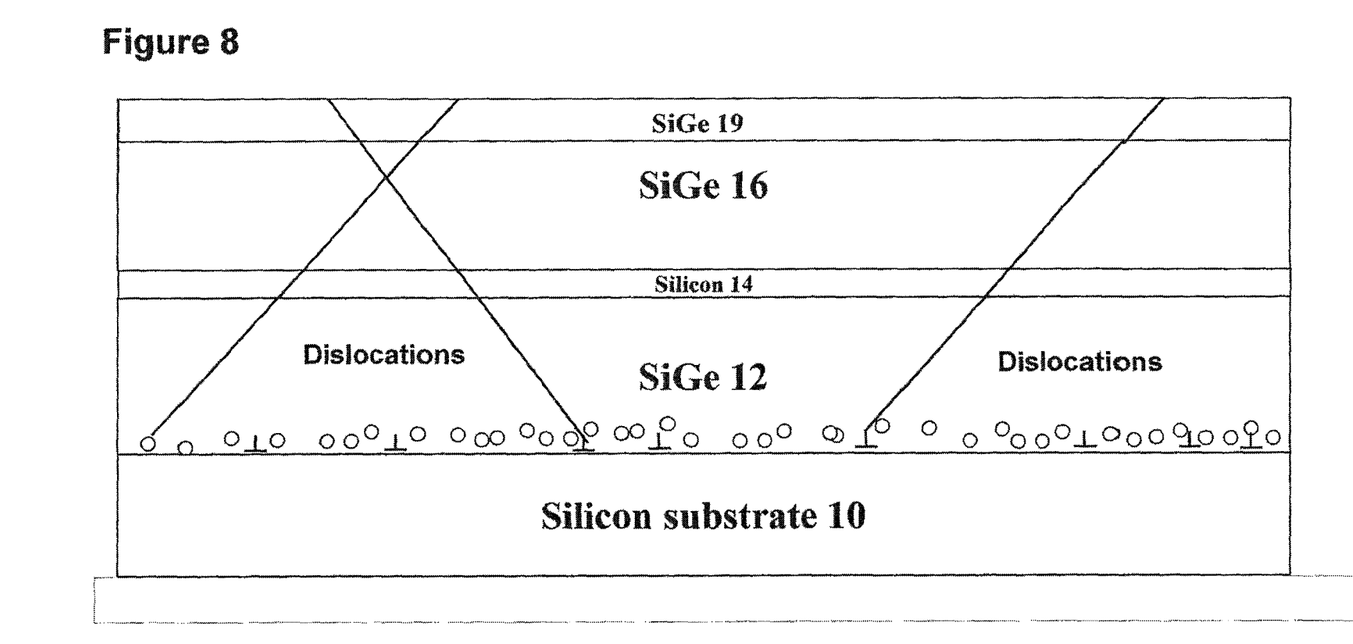
FIG. 8 shows an alternate embodiment based on FIG. 5, where the additional layers on the strained Si cap layer include a second SiGe layer and the optional SiGe layer referred to in the brief description of FIG. 5.

FIG. 5 shows a result of the formation of additional layers on the strained Si cap layer 14. First there is grown onto the strained Silicon layer 14 a second SiGe layer 16, with the same Ge concentration as the SiGe layer 12, and an optional strained Si layer 18 in which NFETs can be formed. The top-most optional strained Si layer 18 could, in some embodiments, instead be, as shown in FIG. 8, an additional SiGe layer 19 with a higher Ge concentration than the first SiGe layer 12. PFETs can be formed in the top-most additional SiGe layer 19 if present. The SiGe layer 16 can have a thickness in a range of about 100 nm to about 1000 nm, and the optional strained Si layer 18 can have a thickness in a range of about 4 nm to about 40 nm. If the top-most additional SiGe layer 19 is formed instead of the optional strained Si layer 18 it can have a thickness in a range of about 4 nm to about 40 nm.

In that the SiGe layer 12 is relaxed, the Silicon layer 14 has the lattice constant of the relaxed SiGe 12, meaning that it is strained silicon. Because of this the upper SiGe layer 16 will grow relaxed and can be grown to any desired thickness. The upper SiGe layer 16 will not have additional defects and can be used for any purpose desired. However, a problem exists in that the dislocation defects can propagate through the upper SiGe layer 16 and into the top Silicon layer 18. These defects can be in the 1e5 to 1e7 range for optimized layers, depending on the SiGe percentage, and are detrimental to subsequently formed transistor devices, such as N-type FINFETS formed in the top Silicon layer 18.

Figure 6:
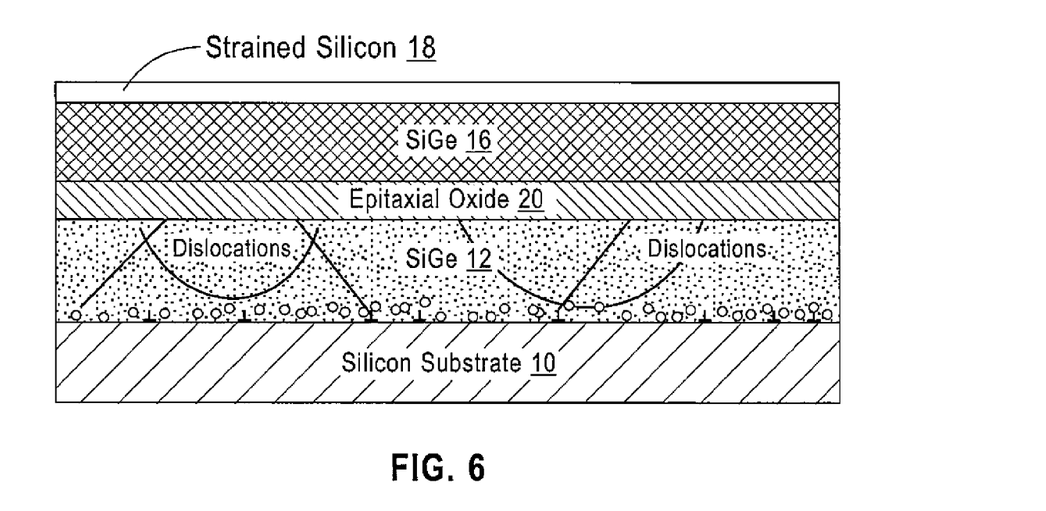
FIG. 6 shows in cross-section a structure in accordance with embodiments of this invention, where the Silicon cap layer is replaced with a layer of epitaxial oxide (which may be referred to as a rare earth oxide), configured to inhibit propagation of threading dislocations from the first semiconductor layer into the second semiconductor layer.

FIG. 6 shows in cross-section a structure in accordance with embodiments of this invention that overcomes the problem of the dislocations propagating into the SiGe layer 16 and into the top-most layer (e.g., the Si layer 18) where devices are formed. In FIG. 6 it can be seen that the Si cap layer 14 is replaced with a layer 20 of epitaxial oxide (which may be referred to as a rare earth oxide). Since the epitaxial oxide 20 is a binary or ternary compound (as non-limiting examples, at least one of $La_2O_3$, $CeO_2$, $Y_2O_3$, $LaYO_3$, $(La_xY_{1-x})_2O_3$) it is more efficient in deflecting the dislocations. Other factors limiting the dislocation propagation include, but need not be limited to: different atomic radii than Si, a different unit cell than Si, and different bonding energies between the group III-metal atoms and the oxygen atoms in the epitaxial oxide. The epitaxial oxides are polar compounds (ions) and are not covalently bound as semiconductors are. The epitaxial oxide layer 20 does not allow the dislocations to propagate into the SiGe layer 16 thus providing a better quality SiGe layer 16 (the defects may typically be in the 1e1 to 1e3 range as compared to the 1e5 to 1e7 range as in the structure shown in FIG. 5). This overcomes the problem of the Si/SiGe interface as shown in FIGS. 1-5, where the layers are quite similar and thus the dislocation reflection is not as effective, even if the layers at the Si/SiGe interface have different stress levels. Further, Si/SiGe crystallizes into a diamond lattice (diamond cubic crystal structure), whereas epitaxial oxides exhibit a cubic lattice (i.e., a different unit cell geometry).

In general, exemplary epitaxial oxide materials grown on the underlying SiGe semiconductor layer 12 include rare earth oxides (e.g., cerium oxide ($CeO_2$), lanthanum oxide ($La_2O_3$), yttrium oxide ($Y_2O_3$), gadolinium oxide ($Gd_2O_3$), europium oxide ($Eu_2O_3$), and terbium oxide ($Tb_2O_3$)). In some embodiments, the crystalline oxide layer 20 includes combinations of rare earth oxides (e.g., a material such as $ABO_3$, where 'A' and 'B' may be any rare earth metal (e.g., lanthanum scandium oxide ($LaScO_3$)). In yet another embodiment, a crystalline oxide layer 20 may include aluminum oxide $Al_2O_3$ or aluminum oxide compounds (e.g., lanthanum aluminum $LaAlO_3$).

Lanthanum oxide ($La_2O_3$) is a well-known oxide which has a larger La to O bond length, since La is a larger atom. However, under normal circumstances $La_2O_3$ crystallizes with a hexagonal structure and cannot be lattice-matched to silicon. There has been reported a cubic bixbyite $La_2O_3$ phase having a lattice constant of 1.138 nm. However, it is not a stable phase under normal pressure and room temperature.

Thus, the use of some known compounds may be problematic. However, the metastable $(La_xY_{1-x})_2O_3$ alloy, at around x=0.3, will be perfectly lattice-matched to silicon and will crystallize in the cubic structure. In spite of the tendency for $La_2O_3$ to crystallize hexagonally, the cubic modification occurs due to crystal structure stabilization from the Y-containing oxide and epitaxial stabilization from the Si substrate. At x=0.33, the lattice constant of the alloy will be 1.086 nm (e.g., twice that of silicon). This follows from a linear interpolation between the $La_2O_3$ lattice constant of 1.138 nm, the $Y_2O_3$ lattice constant of 1.06 nm, and the use of Vegord's law. Further, a lattice constant of the mixed rare earth oxide may be substantially a multiple of a lattice constant of silicon.

A lathanium/yttrium compound epitaxial oxide is formed on the semiconductor layer using methodology familiar to those of skill in the art. The epitaxial oxide in one exemplary embodiment includes 33% $La_2O_3$ and 67% $Y_2O_3$ for matching at two times the lattice constant of silicon. MBE can be employed for forming the epitaxial oxide layer on silicon. U.S. Pat. No. 6,852,575, which is incorporated by reference herewith, discusses the linear interpolation of $La_2O_3$ and $Y_2O_3$ and an alloy created therefrom.

In a method processing can proceed as shown in FIGS. 1-5, with the exception that in FIG. 2 the layer 20 of a selected epitaxial oxide (e.g., at least one of, but not limited to, $La_2O_3$, $CeO_2$, $Y_2O_3$, $Gd_2O_3$, $LaYO_3$, $(La_xY_{1-x})_2O_3$) is grown instead of the Si layer 14. The epitaxial oxide layer 20 can have a thickness in an exemplary range of about 10 nm to about 100 nm, or more specifically a thickness in an exemplary range of about 20 nm to about 50 nm, with a value of about 30 nm being a more preferred thickness for many applications.

If the $(La_xY_{1-x})_2O_3$ material is selected for the epitaxial oxide layer 20 one technique for growing same can be found in, for example, the above referenced commonly assigned U.S. Pat. No. 6,852,575, "Method of forming lattice-matched structure on silicon and structure formed thereby", Bojarczuk, Jr. et al. As is disclosed a metastable $(La_xY_{1-x})_2O_3$ alloy is created. The alloy, at around x=0.33, is perfectly lattice-matched to silicon and crystallizes in the cubic structure.

The procedure involves providing a clean substrate, the SiGe layer 12 in this case, and providing $(La,Y)_2O_3$. In other embodiments samarium can be used (e.g., $(Sm_xY_{1-x})_2O_3$), or Gadolinium can be used (e.g., $(La_xGd_{1-x})_2O_3$), or Gadolinium oxide and Europium oxide can be used (e.g., $(Gd_xEu_{1-x})_2O_3$), or another mixed rare earth oxide can be used.

La and Y are heated using standard high temperature commercial effusion cells. Typical La and Y cell operation temperatures are 1300-1700 C. Depending upon the specific cell temperature, the element fluxes can be controlled (as is typical in a standard molecular beam deposition process) and thereby the relative composition of La:Y can be controlled in the deposited film. Oxygen is provided by a molecular oxygen beam. Alternatively, radio frequency (RF) excited atomic oxygen can be provided as well, or in place of molecular oxygen.

With the La and Y cells raised to the appropriate temperature, and an oxygen flow rate of about 1-sccm, so that the chamber pressure is in about the 1E-5 to 1E-4 range, the epitaxial growth of $(La,Y)_2O_3$ is commenced by opening La and Y shutters with the substrate faring all three sources (e.g., La, Y, and O). The substrate temperature is typically about 650° C., but can be anywhere in the 400-800° C. range. Epitaxial growth of $(La,Y)_2O_3$ then occurs. For $(La_xY_{1-x})_2O_3$, x may be given as 0.02<x<0.80, where lattice matching occurs at around x=0.33.

Following deposition of the oxide, the vacuum chamber is pumped down to about $10^{-9}$ torr to reduce background oxygen pressures. Next, the implant step of FIG. 3 can be performed, followed by the anneal step of FIG. 4, followed by the growth of the SiGe layer 16 and the optional Si layer 18.

Further by example, U.S. Pat. No. 6,610,548, "Crystal Growth Method of Oxide, Cerium Oxide, Promethium Oxide, Multi-Layered Structure of Oxides, Manufacturing Method of Field Effect Transistor, Manufacturing Method of Ferroelectric Non-Volatile Memory and Ferroelectric Non-Volatile Memory", Amii et al. describes a process suitable for forming the epitaxial oxide layer 20 from $CeO_2$.

Another example of a procedure for growing a rare earth oxide can be found in U.S. Pat. No. 7,135,699, "Method and Apparatus for Growth of Single-crystal Rare-earth Oxides, Nitrides, and Phosphides", Atanackovic.

The end result is the formation of a structure as shown in FIG. 6 wherein there is a rare-earth containing oxide layer (the binary or ternary compound layer 20) that is provided within a semiconductor material, where the layer 20 is positioned to inhibit dislocations arising in a first semiconductor layer (layer 12) from propagating into a second semiconductor layer (layer 16).

The structure of FIG. 6 can then be further processed to form any desired devices such as CMOS FINFETs and/or planar transistors. As such, the structure of FIG. 6 can be viewed as an intermediate structure formed during fabrication of an integrated circuit.

Although described in the context of the semiconductor material being SiGe in other embodiments other semiconductor materials could be used, including by example Si and Group III-V materials.

It is to be understood that although the exemplary embodiments discussed above with reference to the embodiment of FIG. 6 can be used during the formation of common variants of FET devices including, e.g., FET devices with multi-fingered FIN and/or gate structures and FET devices of varying gate width and length. Moreover, transistor devices can be connected to metalized pads or other devices by conventional ultra-large-scale integration (ULSI) metalization and lithographic techniques.

Integrated circuit dies can be fabricated with various devices such as a field-effect transistors, bipolar transistors, metal-oxide-semiconductor transistors, diodes, resistors, capacitors, inductors, etc., having contacts that are formed using methods as described herein. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent fabrication processes, including deposition processes, etching processes may be used by those skilled in the art. Further, the exemplary embodiments are not intended to be limited to only those semiconductor and other materials, rare earth metals, insulators, concentrations, layer thicknesses and the like that were specifically disclosed above. Any and all such and similar modifications of the teachings of this invention will still fall within the scope of this invention.

What is claimed is:

1. A structure, comprising:
   a substrate having a top surface;
   a first semiconductor layer disposed on the top surface of the substrate, the first semiconductor layer having a first unit cell geometry;
   a second semiconductor layer, the second semiconductor layer having the first unit cell geometry; and
   a layer comprised of a metal-containing oxide disposed on the first semiconductor layer between the first semiconductor layer and the second semiconductor layer, the second semiconductor layer being disposed on the layer comprised of the metal-containing oxide, the layer of metal-containing oxide having a second unit cell geometry that differs from the first unit cell geometry to inhibit propagation of misfit dislocations from the first semiconductor layer into the second semiconductor layer;
   where the second semiconductor layer is $Si_{1-x}Ge_x$, and further comprising a layer of strained silicon on a top surface of the second semiconductor layer.

2. The structure of claim 1, wherein the first semiconductor layer and the second semiconductor layer are both comprised of $Si_{1-x}Ge_x$, and where the metal-containing oxide layer is comprised of a rare earth metal.

3. The structure of claim 1, wherein the first semiconductor layer and the second semiconductor layer are both comprised of $Si_{1-x}Ge_x$, and where the metal-containing oxide layer is comprised of at least one of cerium oxide ($CeO_2$), lanthanum oxide ($La_2O_3$), yttrium oxide ($Y_2O_3$), gadolinium oxide ($Gd_2O_3$), europium oxide ($Eu_2O_3$), terbium oxide ($Tb_2O_3$), a material $ABO_3$, where 'A' and 'B' may be any rare earth metal including lanthanum scandium oxide ($LaScO_3$) and lanthanum yttrium oxide ($La_xY_{1-x})_2O_3$, samarium yttrium oxide ($Sm_xY_{1-x})_2O_3$ lanthanum gadolinium oxide ($La_xGd_{1-x})_2O_3$ and gadolinium europium oxide ($Gd_xEu_{1-x})_2O_3$.

4. The structure of claim 1, where the misfit dislocations originate from nucleation centers formed by implanted ions.

5. The structure of claim 1, where the first semiconductor layer is a strain relaxed layer comprised of $Si_{1-x}Ge_x$.

6. The structure of claim 1, where the first unit cell geometry exhibits a diamond lattice crystal structure, and where the second unit cell geometry exhibits a cubic lattice crystal structure.

7. The structure of claim 1, where the layer comprised of the metal-containing oxide has a thickness in a range of about 10 nm to about 100 nm, or a thickness in a range of about 20 nm to about 50 nm, or a thickness of about 30 nm.

8. The structure of claim 1, embodied as an intermediate structure during fabrication of an integrated circuit.

9. A structure, comprising:
   a substrate having a top surface;
   a first semiconductor layer disposed on the top surface of the substrate, the first semiconductor layer having a first unit cell geometry;
   a second semiconductor layer, the second semiconductor layer having the first unit cell geometry; and
   a layer comprised of a metal-containing oxide disposed on the first semiconductor layer between the first semiconductor layer and the second semiconductor layer, the second semiconductor layer being disposed on the layer comprised of the metal-containing oxide, the layer of metal-containing oxide having a second unit cell geometry that differs from the first unit cell geometry to inhibit propagation of misfit dislocations from the first semiconductor layer into the second semiconductor layer;
   where the first semiconductor layer is $Si_{1-x}Ge_x$, and further comprising a further layer of $Si_{1-x}Ge_x$ disposed on a top surface of the second semiconductor layer, where the value of x in the further layer of $Si_{1-x}Ge_x$ is greater than the value of x in the first semiconductor layer.

10. The structure of claim 9, wherein the first semiconductor layer and the second semiconductor layer are both comprised of $Si_{1-x}Ge_x$, and where the metal-containing oxide layer is comprised of a rare earth metal.

11. The structure of claim 9, wherein the first semiconductor layer and the second semiconductor layer are both comprised of $Si_{1-x}Ge_x$, and where the metal-containing oxide layer is comprised of at least one of cerium oxide ($CeO_2$), lanthanum oxide ($La_2O_3$), yttrium oxide ($Y_2O_3$), gadolinium oxide ($Gd_2O_3$), europium oxide ($Eu_2O_3$), terbium oxide ($Tb_2O_3$), a material $ABO_3$, where 'A' and 'B' may be any rare earth metal including lanthanum scandium oxide ($LaScO_3$) and lanthanum yttrium oxide ($La_xY_{1-x})_2O_3$, samarium yttrium oxide ($Sm_xY_{1-x})_2O_3$ lanthanum gadolinium oxide ($La_xGd_{1-x})_2O_3$ and gadolinium europium oxide ($Gd_xEu_{1-x})_2O_3$.

12. The structure of claim 9, where the misfit dislocations originate from nucleation centers formed by implanted ions.

13. The structure of claim 9, where the first semiconductor layer is a strain relaxed layer comprised of $Si_{1-x}Ge_x$.

14. The structure of claim 9, where the first unit cell geometry exhibits a diamond lattice crystal structure, and where the second unit cell geometry exhibits a cubic lattice crystal structure.

15. The structure of claim 9, where the layer comprised of the metal-containing oxide has a thickness in a range of about 10 nm to about 100 nm, or a thickness in a range of about 20 nm to about 50 nm, or a thickness of about 30 nm.

16. The structure of claim 9, embodied as an intermediate structure during fabrication of an integrated circuit.

\* \* \* \* \*